(12) United States Patent
Chiu et al.

(10) Patent No.: US 6,960,506 B2
(45) Date of Patent: Nov. 1, 2005

(54) METHOD OF FABRICATING A MEMORY DEVICE HAVING A SELF-ALIGNED CONTACT

(75) Inventors: Hung-Yu Chiu, Hsinchu (TW); Ming-Shang Chen, Hsinchu (TW); Wenpin Lu, Hsinchu (TW); Uway Tseng, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 29 days.

(21) Appl. No.: 10/714,128

(22) Filed: Nov. 13, 2003

(65) Prior Publication Data

US 2005/0106819 A1    May 19, 2005

(51) Int. Cl.⁷ ............................................. H01L 21/336
(52) U.S. Cl. ...................... 438/257; 438/258; 438/294; 438/299; 257/314; 257/315
(58) Field of Search ................................ 438/257, 258, 438/294, 299; 257/314, 315

(56) References Cited

U.S. PATENT DOCUMENTS

| | | | |
|---|---|---|---|
| 2004/0084717 A1 * | 5/2004 | Wang et al. | 257/316 |
| 2004/0147076 A1 * | 7/2004 | Chen et al. | 438/257 |
| 2004/0197992 A1 * | 10/2004 | Yang | 257/316 |

* cited by examiner

Primary Examiner—Alexander Ghyka
(74) Attorney, Agent, or Firm—Stout, Uxa, Buyan & Mullins, LLP

(57) ABSTRACT

A method of forming a memory device having a self-aligned contact is described. The method includes providing a substrate having a floating gate dielectric layer formed thereon, forming a floating poly gate layer on the floating gate dielectric layer, forming a first silicon nitride layer on the floating poly gate layer, and forming a patterned photoresist layer on the first silicon nitride layer. The method further includes etching the first silicon nitride layer and the floating poly gate layer using the patterned photoresist layer as an etch mask, forming an oxide layer over the exposed etched areas, removing the patterned photoresist layer and the first silicon nitride layer to expose the floating poly gate layer, forming poly spaces in the floating poly gate layer, and depositing a second silicon nitride layer over the poly spaces of the floating poly gate layer to form a self-aligned contact.

21 Claims, 5 Drawing Sheets

METHOD OF FABRICATING A MEMORY DEVICE HAVING A SELF-ALIGNED CONTACT

BACKGROUND OF THE INVENTION

1. Field of the Invention

The present invention relates generally to a method of fabricating memory devices and, more particularly, to a method of fabricating a memory device having a self-aligned contact.

2. Description of Related Art

Flash memories are a growing class of non-volatile storage integrated circuits. Flash memories have the capability of electrically erasing, programming or reading a memory cell in the chip. The memory cells in a flash memory are formed using so-called floating gate transistors in which the data is stored in a cell by charging or discharging the floating gate. The floating gate is a conductive material, typically made of polysilicon, which is insulated from the channel of the transistor by a thin layer of oxide or other insulating material, and insulated from the control gate or word line of the transistor by a second layer of insulating material.

The act of charging the floating gate is generally termed the "program" step for a flash memory. This is accomplished through so-called hot electron injection by establishing a large positive voltage between the gate and source, as much as twelve volts, and a positive voltage between the drain and source, such as, for instance, seven volts.

The act of discharging the floating gate is called the "erase" function for a flash memory. This erase function is typically carried out by a F-N tunneling mechanism between the floating gate and the source of the transistor (source erase) or between the floating gate and the substrate (channel erase). For instance, a source erase operation is induced by establishing a large positive voltage from the source to gate, while floating the drain of the respective memory cell. This positive voltage can be as much as twelve volts.

Currently, contactless array non-volatile memory designs are in increasing demand. The contactless arrays include an array of storage cells which are coupled to one another by buried diffusion, and the buried diffusion is only periodically coupled through contacts to a metal bit line. Earlier flash memory designs require a "half" metal contact for each memory cell. Because metal contacts use a significant area on an integrated circuit, they can be a major impediment to creating a high density memory technology. Furthermore, as the devices become smaller and smaller, the area reduction becomes limited by the metal over contact pitches of adjacent drain and source bit lines used to access the storage cells in the array.

A need thus exists in the prior art to eliminate the bottle neck of cell shrinkage, eliminate contact photo register, and/or solve the random defect induced single bit failure problem. A further need exists to develop a method of fabricating a memory device having a self-aligned contact.

SUMMARY OF THE INVENTION

The present invention addresses these needs by providing a method of forming a memory device having a self-aligned contact. The memory device can provide an improved gate coupling ratio, photo window of contact, and cell planarization. In one embodiment, a method of forming a memory device having a self-aligned contact is provided which includes providing a substrate having a floating gate dielectric layer formed thereon, forming a floating poly gate layer on the floating gate dielectric layer, forming a first silicon nitride layer on the floating poly gate layer, and forming a patterned photoresist layer on the first silicon nitride layer. The method further includes etching exposed areas of the first silicon nitride layer and the floating poly gate layer using the patterned photoresist layer as an etch mask, forming an oxide layer over the exposed etched areas, removing the patterned photoresist layer and the first silicon nitride layer to expose the floating poly gate layer, forming poly spaces in the floating poly gate layer, and depositing a second silicon nitride layer over the poly spaces of the floating poly gate layer to form a self-aligned contact. The method can further comprise etching the second silicon nitride layer to create silicon nitride spacer formations, followed by depositing a second floating poly gate, forming an interlayer dielectric film (e.g., an oxide/nitride/oxide film) over the second floating poly gate, and then forming a control poly gate over the interlayer dielectric film.

In another embodiment, a method of forming a memory device having a self-aligned contact, comprises providing a substrate having a floating poly gate layer and oxide features on source and drain sides of the floating poly gate layer; forming poly spaces in the floating poly gate layer; and depositing a silicon nitride layer over the poly spaces of the floating poly gate layer to form a self-aligned contact. The silicon nitride layer can be deposited over the floating poly gate layer and the oxide features, and the method can further comprise etching the silicon nitride layer to expose a portion of the floating poly gate layer. The silicon nitride layer can be etched into silicon nitride spacer formations. Furthermore, the etching of the silicon nitride layer can prevent the formation of a random single bit defect caused by drain/source oxide defect, and the silicon nitride spacer formations can eliminate the random single bit defect between an interface of the floating poly gate feature and the oxide features. The method can further comprise depositing an extra floating poly gate layer over the floating poly gate layer, the oxide features, and the silicon nitride spacer formations to increase gate coupling ratio; and depositing an interlayer dielectric (such as an oxide/nitride/oxide stack film) on the floating poly gate layer and then depositing a control poly gate to form a flash device. In accordance with another aspect, the etching of the first silicon nitride layer comprises a dry etch process. In other embodiments, apparatuses formed using the above methods are provided.

Any feature or combination of features described herein are included within the scope of the present invention provided that the features included in any such combination are not mutually inconsistent as will be apparent from the context, this specification, and the knowledge of one skilled in the art. For purposes of summarizing the present invention, certain aspects, advantages and novel features of the present invention are described herein. Of course, it is to be understood that not necessarily all such aspects, advantages or features will be embodied in any particular embodiment of the present invention. Additional advantages, aspects, and embodiments of the present invention are apparent in the following detailed description and claims.

DETAILED DESCRIPTION OF THE PRESENTLY PREFERRED EMBODIMENTS

Figure 1:
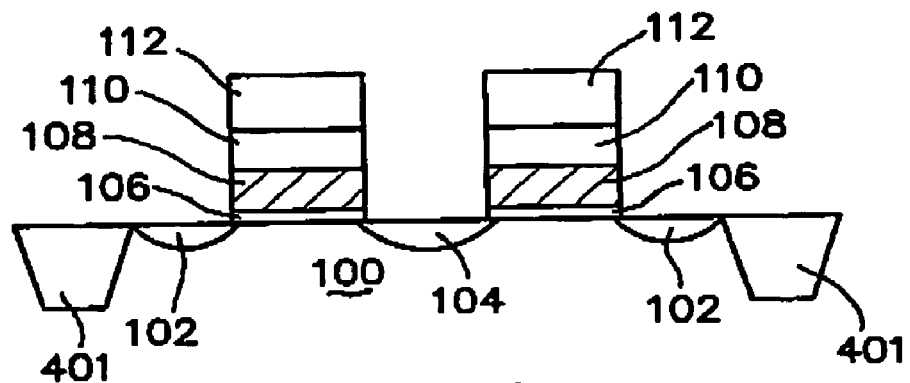
FIG. 1 is a cross-sectional view of a substrate having a buried diffusion drain region and a buried diffusion source region, a floating gate dielectric layer formed on the substrate, a floating poly gate layer formed on the floating gate dielectric layer, and a silicon nitride layer formed on the floating poly gate layer in accordance with an illustrated embodiment of the present invention.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. It is to be understood and appreciated that the process steps and structures described herein do not cover a complete process flow for the manufacture of memory devices having self-aligned contacts. The present invention may be practiced in conjunction with various photolithography techniques that are conventionally used in the art, and only so much of the commonly practiced process is included herein as are necessary to provide an understanding of the present invention. The present invention has applicability in the field of semiconductor devices and processes in general. For illustrative purposes, however, the following description pertains to methods for fabricating memory devices having self-aligned contacts.

Referring more particularly to the drawings, FIG. 1 is a cross-sectional view of a substrate 100 having a buried diffusion drain region 102 and a buried diffusion source region 104, a floating gate dielectric layer 106 formed on the substrate 100, a floating poly gate layer 108 formed on the floating gate dielectric layer 106, and a silicon nitride (SiN) layer 110 formed on the floating poly gate layer 108. Hence, the floating gate dielectric layer 106, the floating poly gate layer 108, and the silicon nitride layer 110 are sequentially formed on the substrate 100. Preferably, the substrate 100 is made of a single crystalline silicon material. Alternatively, the substrate 100 can be made of materials such as gallium nitride (GaN), gallium arsenide (GaAs), or other materials commonly recognized as suitable semiconductor materials to those skilled in the art. The substrate 100 can be slightly doped with p-type dopants (e.g., arsenic, phosphorus, and antimony) or n-type dopants (e.g., boron and boron difluoride). The substrate 100 has shallow trench isolation (STI) regions 401 for dividing the substrate 100 into active regions. The STI regions 401 can be formed using a conventional STI process.

A photoresist layer 112 is formed on top of the silicon nitride layer 110 and is patterned in order to define the regions to etch. In one embodiment, the photoresist layer 112 is patterned to etch portions of the silicon nitride layer 110, the floating poly gate layer 108, and the floating gate dielectric layer 106 that are located above for example the drain region 102 and the source region 104. Preferably, using the photoresist layer 112 as an etch mask, portions of the silicon nitride layer 110, the floating poly gate layer 108, and the floating gate dielectric layer 106 are etched with a plasma having a higher selectivity for silicon than for dielectric materials. Specifically, the etching is performed on the silicon nitride layer 110 and the floating poly gate layer 108 on the condition that the etch rate of the silicon nitride layer 110 and the floating poly gate layer 108 is higher than the etch rate of the floating gate dielectric layer 106, and is stopped when the upper surface of the substrate 100 is exposed. This is similar to etching the silicon nitride layer 110, the floating poly gate layer 108, and the floating gate dielectric layer 106 using the substrate 100 as an etch stopper. In one embodiment, a wet etching process using phosphoric acid ($H_3PO_4$) and the like may be performed to remove the silicon nitride layer 110, the floating poly gate layer 108, and the floating gate dielectric layer 106.

Figure 2:
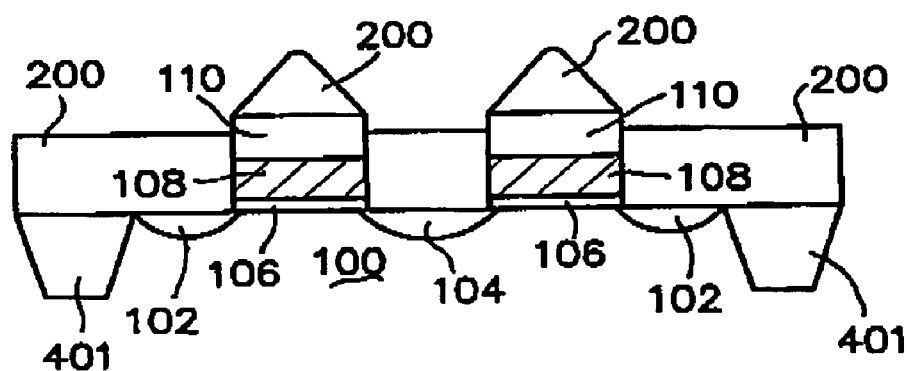
FIG. 2 is a cross-sectional view of the configuration depicted in FIG. 1 wherein an oxide layer has been formed on the substrate in accordance with an illustrated embodiment of the present invention.

FIG. 2 is a cross-sectional view of the configuration depicted in FIG. 1 where portions of the silicon nitride layer 110, the floating poly gate layer 108, and the floating gate dielectric layer 106 have been removed and an oxide layer 200 has been formed over the substrate 100. In particular, the oxide layer 200 is formed to the cell oxide of the buried diffusion drain region 102 and the buried diffusion source region 104. Preferably, the oxide layer 200 is a high-density plasma deposited oxide. The remaining portion of the floating poly gate layer 108 is sometimes referred to as a floating poly gate 108. Prior to formation of the oxide layer 200, the photoresist layer 112 is removed using a dry stripping method, which uses plasma gases, such as $O_3$ and $O_3/N_2O$, or a wet stripping method, which uses acids, such as $H_2SO_4/H_2O_2$, or organic solvents. The dry and wet stripping methods are well-known etching techniques.

Figure 3:
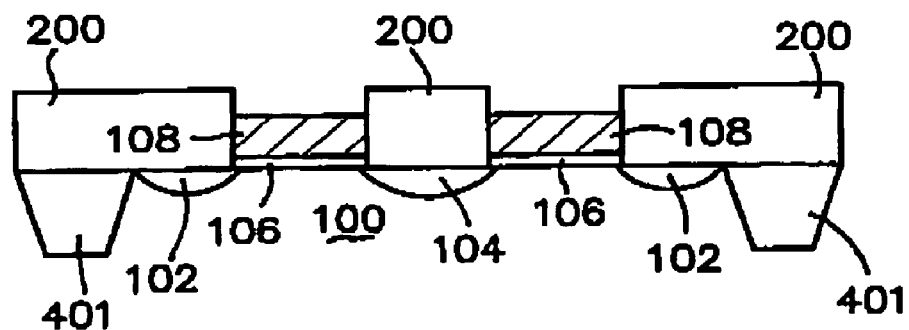
FIG. 3 is a cross-sectional view of the configuration depicted in FIG. 2 wherein the silicon nitride layer is removed using the oxide layer as an etch mask in accordance with an illustrated embodiment of the present invention.

Using the oxide layer 200 as an etch mask, the silicon nitride layer 110 is etched with an acid such as phosphoric acid ($H_3PO_4$), which has a higher selectivity for silicon than for dielectric materials (see FIG. 3). Specifically, the etching is performed on the silicon nitride layer 110 on the condition that the etch rate of the silicon nitride layer 110 is higher than the etch rate of the oxide layer 200, and is stopped when the upper surface of the floating poly gate 108 is exposed. This is similar to etching the silicon nitride layer 110 using the floating poly gate 108 as an etch stopper.

Figure 4A:
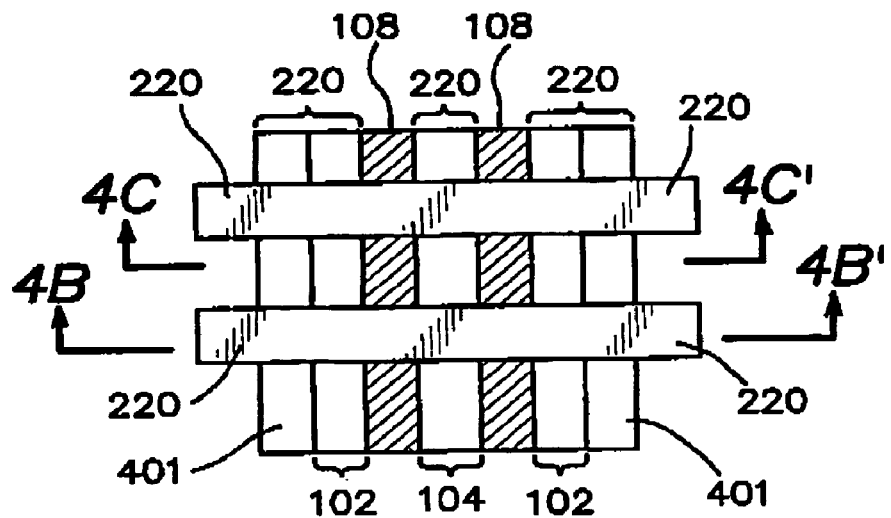
FIGS. 4a–4c are views of the configuration depicted in FIG. 3 wherein poly spaces are formed in floating poly gates in accordance with an illustrated embodiment of the present invention.

FIG. 4a is a top view of the configuration depicted in FIG. 3 wherein, in accordance with one aspect of the present invention, bottom anti-reflective coating (BARC) and photoresist layers are applied and processed over the floating poly gate 108 using conventional photolithographic processes to form a photoresist mask 220, which is then used to etch poly spaces 400 (FIG. 4c) in the floating poly gates 108. The BARC can comprise an organic anti-reflective coating layer which is deposited to a thickness necessary to sufficiently minimize optical reflections of the radiation used to expose the photoresist mask. After etching of the poly spaces 400, the patterned photoresist layer and BARC can be removed using techniques known to those skilled in the art.

Figure 4B:
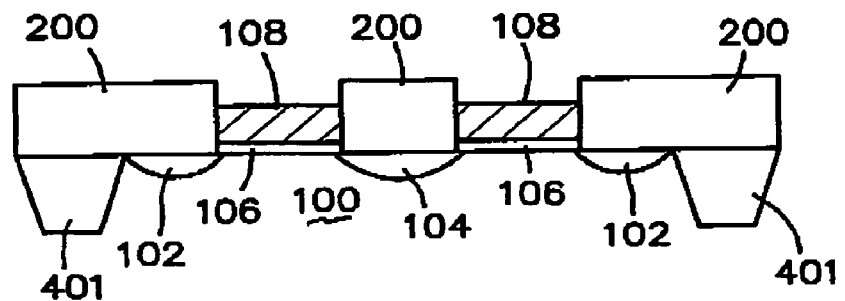
Figure 4C:
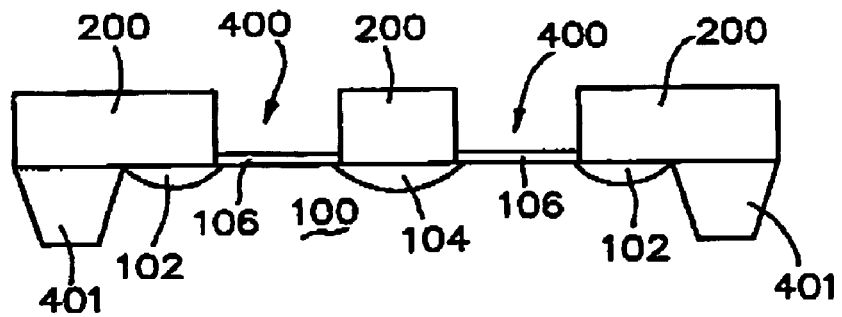

FIGS. 4b and 4c, which are taken along the lines 4b–4b' and 4c–4c' of FIG. 4a, respectively, show the resulting structure after etching has been performed and the photoresist mask 220 removed. The etch process etches exposed poly of poly gates 108 to form poly spaces 400 while only causing minor oxide loss on the buried drain/source oxide layer 200. Portions defining floating poly gates 108 are protected by the photoresist mask 220 during the removal process.

Figure 5A:
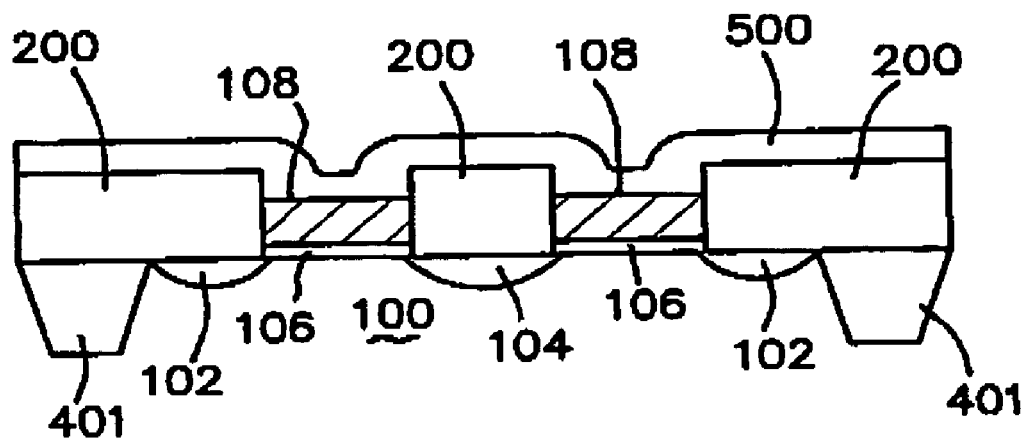
FIGS. 5a and 5b are cross-sectional views of the configurations depicted in FIGS. 4b and 4c, respectively, wherein a silicon nitride layer is deposited on the silicon nitride layer and the oxide layer in accordance with an illustrated embodiment of the present invention.
Figure 5B:
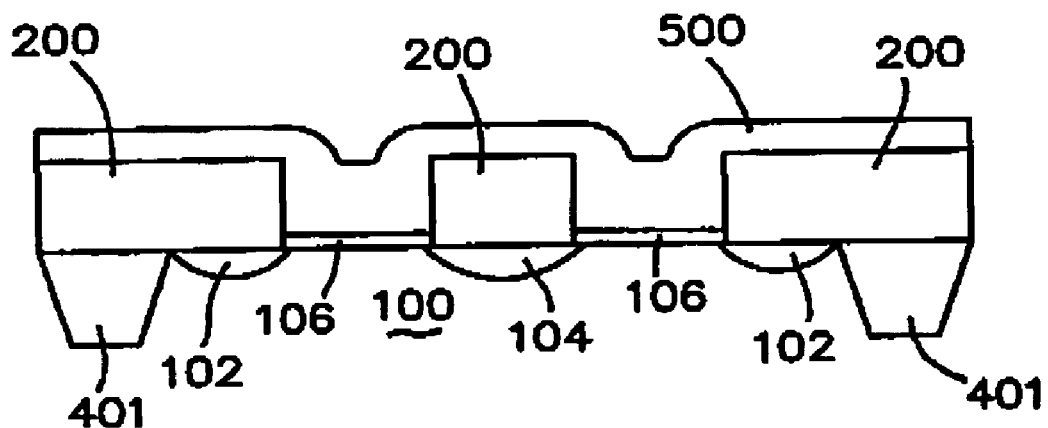

FIGS. 5a and 5b are cross-sectional views of the structure of FIGS. 4b and 4c, respectively, after a silicon nitride layer 500 has been deposited over the poly spaces 400 to fill in the poly spaces 400 and over both the floating poly gates 108 and oxide layer 200. In accordance with one aspect of the present invention, the silicon nitride layer 500 filled into the poly spaces 400 forms a hard mask and a self-aligned contact (SAC). The SAC can increase the photo window of contact (CO) lithography which can relax photo misalignment criteria. The SAC can also provide memory cell shrinkage since memory cell shrinkage will not be limited by contact misalignment. In one embodiment, the silicon nitride layer 500 is deposited on the upper surface of the floating poly gate layer 108 to a thickness of between about 200 and 1000 Å and over the surface of the oxide layer 200 to a thickness of between about 200 and 1000 Å.

Figure 6A:
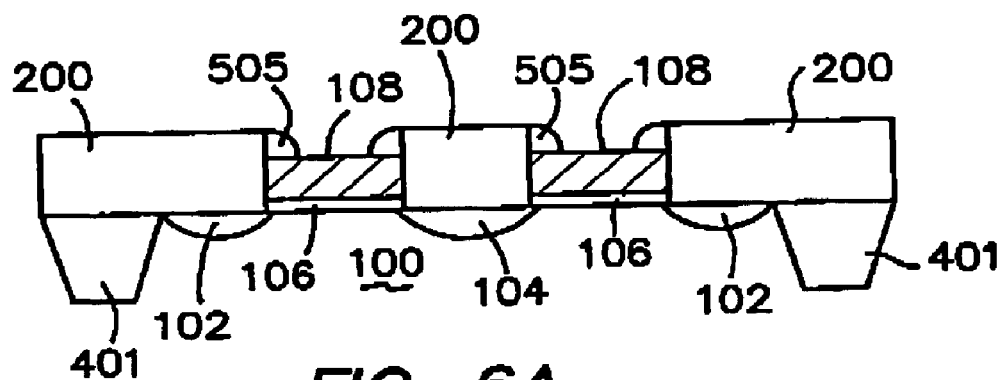
FIGS. 6a and 6b are cross-sectional views of the configurations depicted in FIGS. 5a and 5b, respectively, showing the silicon nitride layer etched back to form silicon nitride spacer formations in accordance with an illustrated embodiment of the present invention.
Figure 6B:
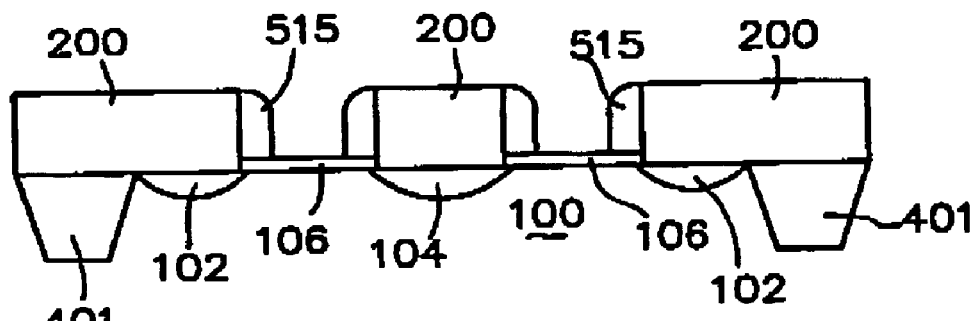

FIGS. 6a and 6b are cross-sectional views of the configurations depicted in FIGS. 5a and 5b, respectively, showing the silicon nitride layer 500 being etched back to form silicon nitride spacer formations. The etch back process may comprise, for example, a wet etch and/or a dry etch, and preferably comprises a dry etch. In accordance with an aspect of the present invention, the silicon nitride layer 500 is etched back to expose top surfaces of the floating poly gates 108 as shown in the cross-sectional view of FIG. 6a, and is also etched back to expose top surfaces of the floating gate dielectric layer 106 as shown in the cross-sectional view of FIG. 6b.

Regarding the etch back process, in accordance with a preferred embodiment of the invention, first portions 505 and second portions 515 of the silicon nitride layer 500 remain on sidewalls of the oxide layer 200 following the etch back process. In particular, the first portions 505 of the silicon nitride layer 500 remain over portions of the floating poly gates 108 and the second portions 515 of the silicon nitride layer 500 remain over portions of the floating gate dielectric layer 106. In accordance with an aspect of the present invention, the first portions 505 of the silicon nitride layer 500 are shaped during the etch back process into silicon nitride spacer formations.

The silicon nitride layer 500 can be dry etched with higher selectivity for silicon than for dielectric materials in such a manner as is known to those skilled in the art. The silicon nitride layer 500 can be etched for a time sufficient to expose a portion of the floating poly gate 108, at which point the etching is terminated before substantial portions of the floating poly gate 108 are removed.

Figure 7:
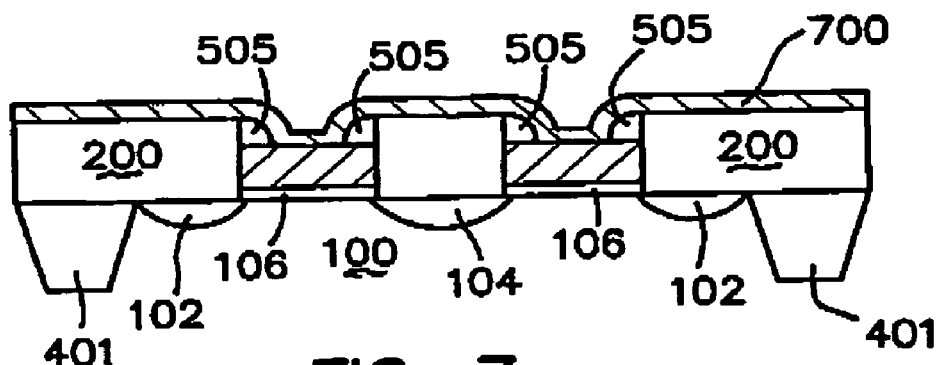
FIG. 7 is a cross-sectional view of the configuration depicted in FIG. 6a wherein a second floating poly gate layer is deposited on the first floating poly gate, the oxide layer, and the etched silicon nitride layer in accordance with an illustrated embodiment of the present invention.

The silicon nitride spacer formation can enlarge a photo, misalignment window of a subsequent post floating poly gate 700 (FIG. 7) lithography, since contact etching can stop on the nitride and contact will not be close to the poly gate even when contact to poly gate misalignment occurs. FIG. 7 is a cross-sectional view of the configuration depicted in FIG. 6a wherein a subsequent or second floating poly gate layer 700 is deposited over the first floating poly gate 108, the oxide layer 106, and the etched silicon nitride layer 505 in accordance with an illustrated embodiment of the present invention.

Figure 8:
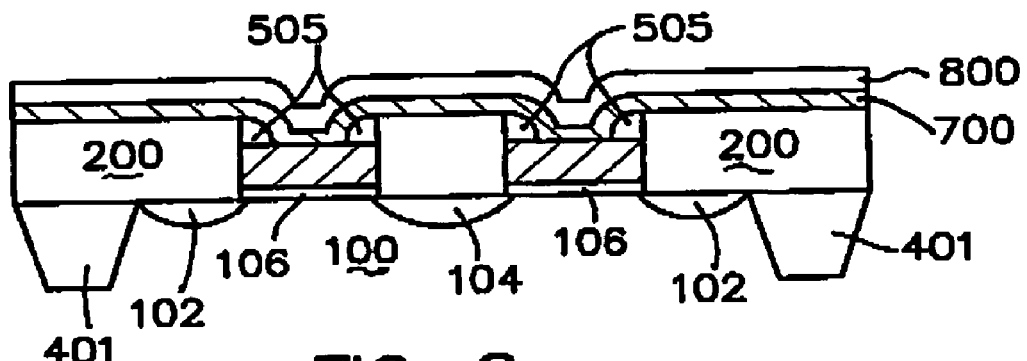
FIG. 8 is a cross-sectional view of the configuration depicted in FIG. 7 wherein the second floating poly gate is etched and an interlayer dielectric layer (e.g., an oxide/nitride/oxide stack film) is deposited on the second floating gate.
Figure 9:
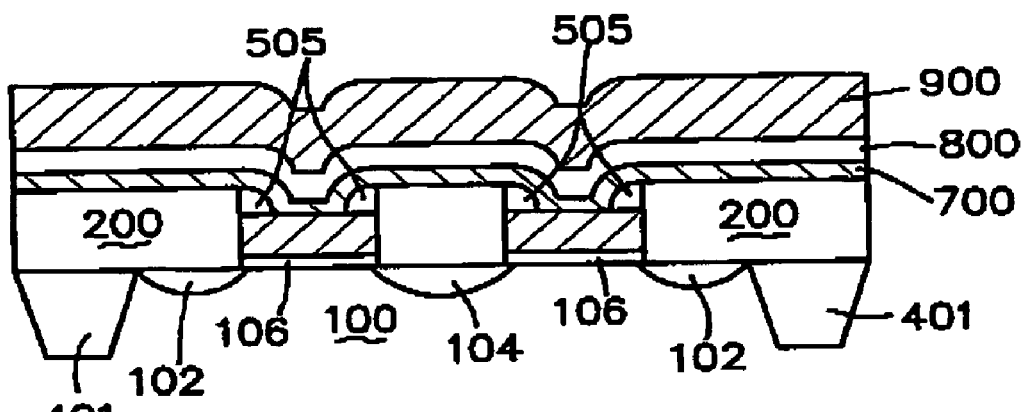
FIG. 9 is a cross-sectional view of the configuration depicted in FIG. 8 wherein a control gate poly silicon is deposited and etched.

FIG. 8 is a cross-sectional view of the configuration depicted in FIG. 7 wherein an interlayer dielectric (e.g., an oxide/nitride/oxide film) 800 is deposited on the floating poly gate layer 700 to isolate the floating poly gate layer 700 and a subsequently applied control poly gate 900 (FIG. 9).

FIG. 9 is a cross-sectional view of the configuration depicted in FIG. 8 wherein a control poly gate layer is deposited on interlayer dielectric 800 and is then etched to form a control poly gate 900. In one embodiment, a SiN film (not shown) is then applied and etched back to expose the control poly gate 900.

Figure 10:
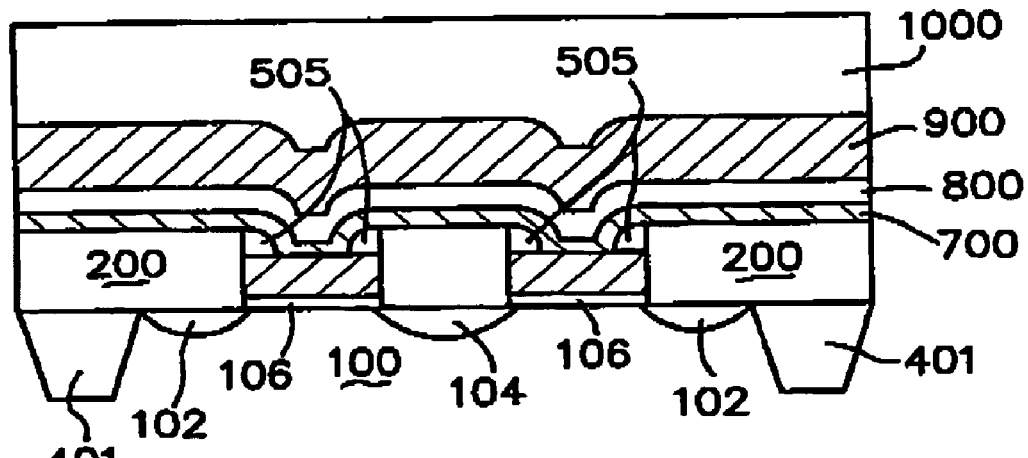
FIG. 10 is a cross-sectional view of the configuration depicted in FIG. 9 wherein an interlayer dielectric film is deposited.

FIG. 10 is a cross-sectional view of the configuration depicted in FIG. 9 wherein an interlayer dielectric (ILD) 1000 is deposited on the control poly gate 900 resulting in a self-aligned contact formation. The ILD 1000 can be made of a silicon dioxide ($SiO_2$) material or a doped glass material to a thickness of between about 7000 and 12000 Å. The ILD 1000 is deposited over the control poly gate 900 by chemical vapor deposition (CVD) at a temperature in the range of between about 650 degree Celsius (C) and 900 degree C. Preferably, the ILD 1000 is planarized by chemical-mechanical polishing(CMP) or by thermal reflow. The ILD1000 isolates the gates from overlying conductive layers. When the ILD 1000 is finished, the silicon nitride layer 500 is defined to the hard mask of the contact photo.

In view of the foregoing, it will be understood by those skilled in the art that the methods of the present invention can facilitate formation of semiconductor devices, and in particular the formation of a memory device having a self-aligned contact. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A method of forming a memory device having a self-aligned contact, comprising:
   providing a substrate having a floating gate dielectric layer formed thereon;
   forming a floating poly gate layer on the floating gate dielectric layer;
   forming a first silicon nitride layer on the floating poly gate layer;
   forming a patterned photoresist layer on the first silicon nitride layer;
   etching exposed areas of the first silicon nitride layer and the floating poly gate layer using the patterned photoresist layer as an etch mask;
   forming an oxide layer over the exposed etched areas;
   removing the patterned photoresist layer and the first silicon nitride layer to expose the floating poly gate layer;
   forming poly spaces in the floating poly gate layer; and
   depositing a second silicon nitride layer over the poly spaces of the floating poly gate layer to form a self-aligned contact.

2. The method as set forth in claim 1, wherein the depositing of a second silicon nitride layer comprises depositing a second silicon nitride layer over the floating poly gate layer and the oxide layer.

3. The method as set forth in claim 1, further comprising etching the first silicon nitride layer to expose a portion of the floating poly gate layer.

4. The method as set forth in claim 3, further comprising etching the second silicon nitride layer to create silicon nitride spacer formations.

5. The method as set forth in claim 4, wherein the silicon nitride spacer formations are formed over the floating poly gate layer.

6. The method as set forth in claim 1, wherein:
   the floating poly gate layer is a first floating poly gate layer;
   the method further comprises depositing a second floating poly gate layer over the first floating poly gate layer, the oxide layer, and the silicon nitride spacer formations.

7. The method as set forth in claim 6, further comprising depositing an interlayer dielectric on the second floating poly gate layer.

8. The method as set forth in claim 7, wherein the interlayer dielectric comprises an oxide/nitride/oxide stacked film.

9. The method as set forth in claim 3, wherein the etching of the first silicon nitride layer comprises a dry etch process.

10. The device formed using the method of claim 1.

11. The device formed using the method of claim 4.

12. The device formed using the method of claim 8.

13. A method of forming a memory device having a self-aligned contact, comprising:
    providing a substrate having a floating poly gate layer and oxide features on source and drain sides of the floating poly gate layer;
    forming poly spaces in the floating poly gate layer; and
    depositing a silicon nitride layer over the poly spaces of the floating poly gate layer to form a self-aligned contact.

14. The method as set forth in claim 13, wherein:
    the silicon nitride layer is deposited over the floating poly gate layer and the oxide features; and
    the method further comprises etching the silicon nitride layer to expose a portion of the floating poly gate layer.

15. The method as set forth in claim 14, wherein the silicon nitride layer is etched into silicon nitride spacer formations.

16. The method as set forth in claim 15, wherein the etching of the silicon nitride layer results in formation of silicon nitride spacer formations over the floating poly gate layer.

17. The method as set forth in claim 15, wherein the floating poly gate layer is a first floating poly gate layer and the method further comprises:
    depositing a second floating poly gate layer over the first floating poly gate layer, the oxide features, and the silicon nitride spacer formations; and
    depositing an interlayer dielectric on the second floating poly gate layer.

18. The method as set forth in claim 15, wherein the etching of the silicon nitride layer comprises a wet etch process.

19. The device formed using the method of claim 13.

20. The device formed using the method of claim 15.

21. The device formed using the method of claim 17.

* * * * *